United States Patent
Müller et al.

(10) Patent No.: US 6,309,566 B1
(45) Date of Patent: Oct. 30, 2001

(54) METHOD AND MOLD FOR PRODUCING AN ELECTROOPTICAL MODULE, AND ELECTROOPTICAL MODULE

(75) Inventors: Gustav Müller; Hans Hurt, both of Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/523,154

(22) Filed: Mar. 10, 2000

(30) Foreign Application Priority Data

Feb. 22, 1999 (DE) .............................. 199 09 242

(51) Int. Cl.⁷ ..................................... B29D 11/00
(52) U.S. Cl. ............................ 264/1.25; 264/2.5; 385/92
(58) Field of Search ................. 385/88–94, 14; 264/1.1, 1.24, 1.25, 2.5

(56) References Cited

U.S. PATENT DOCUMENTS

| 3,389,267 | 6/1968 | Aconsky . | |
|---|---|---|---|
| 6,254,285 | * 7/2001 | Grumm et al. | 385/88 |
| 6,254,286 | * 7/2001 | Grumm et al. | 385/88 |

FOREIGN PATENT DOCUMENTS 197 11 138
   A1    9/1998 (DE) .

OTHER PUBLICATIONS

International Patent Application WO 98/06141 (Severn), dated Feb. 12, 1998.

* cited by examiner

Primary Examiner—Phan T. H. Palmer
(74) Attorney, Agent, or Firm—Herbert L. Lerner; Laurence A. Greenberg; Werner H. Stemer

(57) ABSTRACT

A method for producing an electrooptical module having a molding made of a translucent, moldable material, includes positioning a support with an electrooptical transducer in a mold. The support with the transducer is encased by a moldable material to form the molding and the mold has at least one functional surface for coupling. In order to permit and facilitate the production of an electrooptical transducer with a very precisely positioned functional surface and a high mechanical strength, a dead mold is used in the form of a module housing having an opening for the introduction of the support and a coupling region for a coupling partner. A housing part which is located in the coupling region is configured to correspond to the functional surface. A mold for producing an electrooptical module, and an electrooptical module, are also provided.

9 Claims, 2 Drawing Sheets

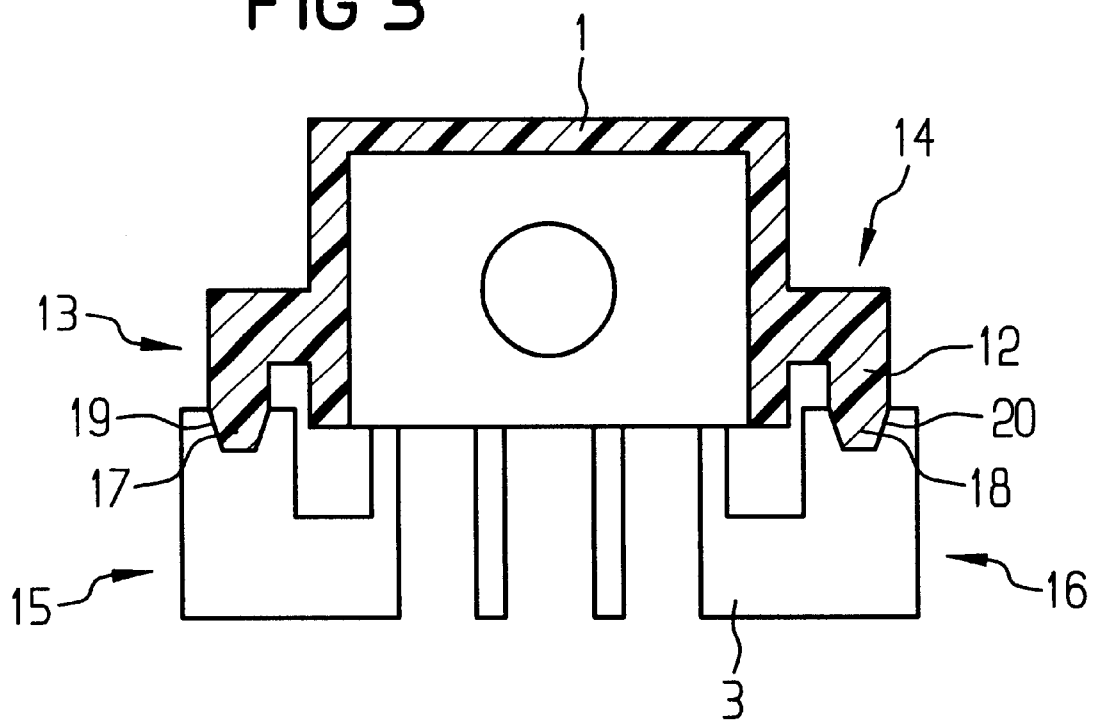
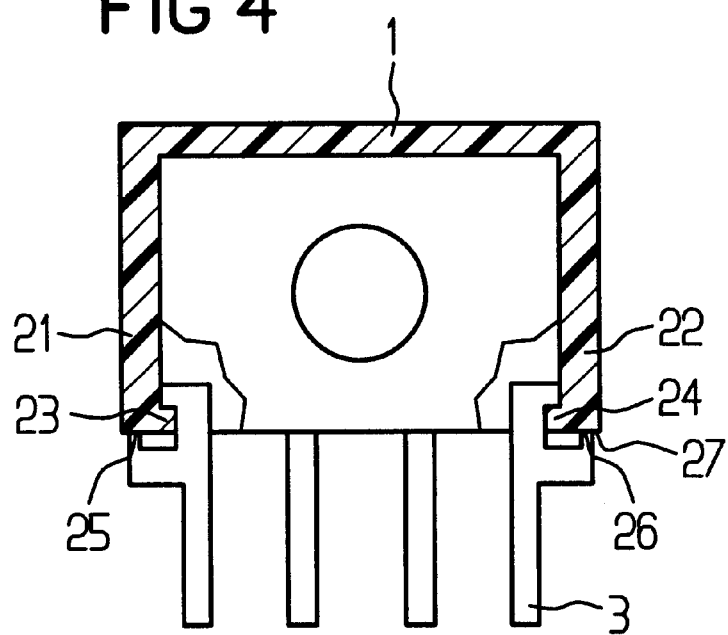

METHOD AND MOLD FOR PRODUCING AN ELECTROOPTICAL MODULE, AND ELECTROOPTICAL MODULE

BACKGROUND OF THE INVENTION

Field of the Invention

The invention relates to a method for producing an electrooptical module having a molding made of a translucent, moldable material, in which a support with a positioning device and with at least one electrooptical transducer fitted and aligned thereon is positioned precisely in a mold by the positioning device, the support with the transducer is at least partially encased by the moldable material to form the molding, and the molding has at least one functional surface for coupling to a coupling partner. The invention also relates to a mold for producing an electrooptical module, and to an electrooptical module.

A method of that type is known from German Published, Non-Prosecuted Patent Application DE 197 11 138 A1, corresponding to U.S. patent application Ser. No. 09/390,167, filed Sep. 7, 1999. In the case of that known method, an electrooptical transducer is disposed in a predetermined position on a support which is provided with at least one positioning element as a positioning device. The support is positioned precisely in an insertion device through the use of the positioning element. Thereafter, the support is positioned precisely in a mold through the use of the positioning element and is encased by moldable material, forming a molding and a functional surface. The functional surface, e.g. a lens, serves for coupling to a coupling partner in that case.

SUMMARY OF THE INVENTION

It is accordingly an object of the invention to provide a method and a mold for producing an electrooptical module, and an electrooptical module, which overcome the hereinafore-mentioned disadvantages of the heretofore-known methods and devices of this general type and in which it is possible to achieve a precise configuration and formation of a functional surface on the electrooptical module, in a comparatively straightforward manner in production terms.

With the foregoing and other objects in view there is provided, in accordance with the invention, a method for producing an electrooptical module, which comprises providing a module housing acting as a mold and having an opening and a coupling region for a coupling partner; aligning and fitting at least one electrooptical transducer on a support having a positioning device; introducing the support having the at least one electrooptical transducer through the opening; precisely positioning the support having the at least one electrooptical transducer in the module housing with the positioning device; providing a housing part having an inner side with a configuration corresponding to an outer contour of a functional surface; placing the housing part in the coupling region; and introducing a translucent moldable material into the module housing and at least partially encasing the support having the transducer with the moldable material forming a molding having the least one functional surface for coupling to a coupling partner.

An essential advantage of the method according to the invention is that, through the use of the method the functional surface may be provided on the electrooptical module with highly precise positioning, in a comparatively straightforward manner in production terms. This can be attributed essentially to the fact that use is made of a prefabricated module housing into which the translucent, moldable material is poured once the support has been introduced. Due to shrinkage processes during the curing of the moldable material, it is not possible for adjustment inaccuracies to arise, by virtue of the prefabricated module housing being used. A further advantage of the method according to the invention is that the prefabricated module housing may also be produced by injection molding and may thus also be provided with undercuts. An additional advantage is that, by virtue of using a prefabricated module housing, preferably with injection molding, using a material which is particularly strong in mechanical terms in the cured state makes it possible to achieve a relatively high mechanical strength for the electrooptical module being produced.

In order to obtain a usable electrooptical module, it is necessary to free the electrooptical module from the housing part which is located in the coupling region. This can be carried out in different ways. In accordance with another mode of the invention, in order to facilitate this step, it is particularly advantageous if the housing part has a predetermined breaking point on its border. The predetermined breaking point then allows the housing part to be broken off easily.

In accordance with a further mode of the invention, it is also advantageous if the mold is a module housing with a coupling region which is configured as a stub that forms an insertion socket for receiving the coupling partner. The advantage of this configuration of the method according to the invention is, in particular, that it is easier to use the moldable material for molding purposes. This is because, rather than forming the stub itself, the stub is already provided on the module housing.

In accordance with an added mode of the invention, once the molding has been formed, the housing part, which is provided with a break-off attachment on its outer side, is removed from the module housing by subjecting the break-off attachment to the action of force. This makes it possible, despite the housing part being concealed in the interior of the stub, for the housing part to be easily removed in order to expose the functional surface.

In the case of the method according to the invention, the positioning device may be configured in different ways. In accordance with an additional mode of the invention, it is particularly advantageous if extensions on the support serve as the positioning device and are latched to the module housing when the support with the transducer is positioned in the housing.

The invention also relates to a mold for producing an optical module having a molding made of a translucent, moldable material, wherein a support with a positioning device and with at least one electrooptical transducer fitted and aligned thereon is positioned precisely in the mold through the use of the positioning device, the support with the transducer is at least partially encased by the moldable material to form the molding, and the molding has at least one functional surface for coupling to a coupling partner. Such a mold is likewise described in German Published, Non-Prosecuted Patent Application DE 197 11 138 A1, corresponding to U.S. patent application Ser. No. 09/390,167, filed Sep. 7, 1999, which has already been described above.

Therefore, with the objects of the invention in view there is also provided a mold for producing an optical module, comprising a module housing having an opening and a coupling region for a coupling partner; a support to be introduced through the opening into the module housing, the support having a positioning device for precisely positioning the support in the module housing; at least one electrooptical transducer fitted and aligned on the support; a translucent, moldable material at least partially encasing the support with the at least one electrooptical transducer to form a molding having at least one functional surface with an outer contour for coupling to the coupling partner; and a housing part disposed in the coupling region and having an inner side with a configuration corresponding to the outer contour of the functional surface.

This increases the adjustment accuracy and the mechanical strength of an electrooptical module, having a molding made of a translucent, moldable material, which is to be produced.

Although the mold, unlike the known mold, is a dead mold, it provides an advantage which is that using it improves the adjustment accuracy of the functional surface on the electrooptical module and also increases the mechanical strength of the module.

In accordance with another feature of the invention, as far as its housing part is concerned, the mold has a predetermined breaking point on the border or edge of the housing part, in order for it to be possible for the housing part to be easily removed, exposing the functional surface of the electrooptical module.

In accordance with a further feature of the invention, the coupling region is advantageously constructed as a stub which forms an insertion socket for receiving the coupling partner.

In accordance with an added feature of the invention, the housing part has a break-off attachment on its outer side.

The invention also relates to an electrooptical module having a molding made of a translucent, moldable material, wherein a support with an electrooptical transducer is at least partially encased by the moldable material to form the molding, and the molding has at least one functional surface for coupling to a coupling partner. The construction of such an electrooptical module may likewise be gathered from German Published, Non-Prosecuted Patent Application DE 197 11 138 Al, corresponding to U.S. patent application Ser. No. 09/390,167, filed Sep. 7, 1999, which has been discussed above.

With the objects of the invention in view there is also provided an electrooptical module, comprising a module housing having an opening and a coupling region for a coupling partner; a support to be introduced through the opening into the module housing; an electrooptical transducer disposed on the support; a housing part to be placed in the coupling region and then removed, the housing part having an inner side; and a translucent, moldable material filling the module housing, at least partially encasing the support with the electrooptical transducer and forming a molding having at least one functional surface for coupling to the coupling partner, the at least one functional surface formed by the housing part and having an outer contour corresponding to the inner side of the housing part.

In accordance with a concomitant feature of the invention, the module housing has a coupling region which is constructed as a stub that forms an insertion socket for receiving the coupling partner.

Other features which are considered as characteristic for the invention are set forth in the appended claims.

Although the invention is illustrated and described herein as embodied in a method and a mold for producing an electrooptical module, and an electrooptical module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a side-elevational view of the finished electrooptical module with a first positioning device; and FIG. 4 is a side-elevational view of a further finished electrooptical module with a second positioning device.

DESCRIPTION OF THE PREFERRED EMBODIMENTS

Figure 1:
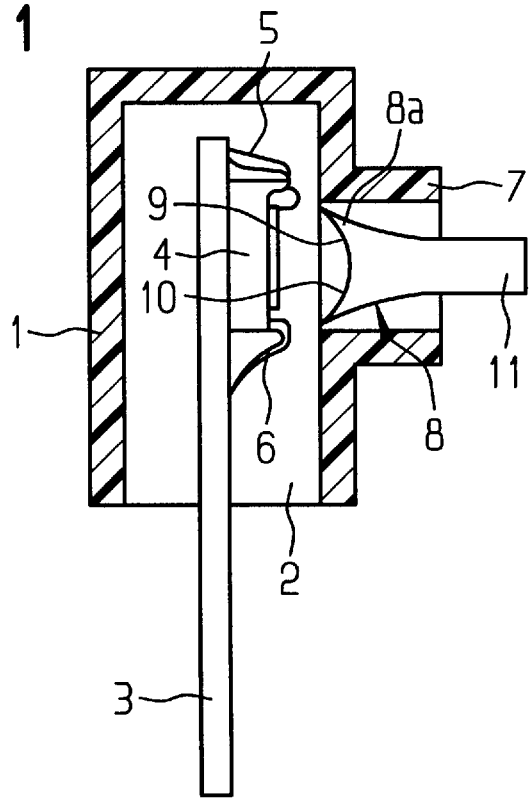
FIG. 1 is a diagrammatic, sectional view of a module housing which is used in the method according to the invention and which has a support introduced therein.

Referring now to the figures of the drawings in detail and first, particularly, to FIG. 1 thereof, it is seen that the method according to the invention is implemented by using a prefabricated module housing 1 which has a cup-like structure and which is provided on its side, that is at the bottom in FIG. 1, with a relatively large opening 2 for the introduction of a support 3. The support 3 may be a so-called lead frame, for example. An electrooptical transducer 4 is fitted in a precisely positioned manner on the support 3 in a preceding method step and the electrooptical transducer 4 is connected electrically to the support 3 through electric conductors 5 and 6.

FIG. 1 also shows that the module housing 1 is moreover provided with a stub 7 which constitutes an insertion socket for receiving a coupling partner 29 (shown in FIG. 2) of the electrooptical module which is to be produced. A housing part 8 is located on the inside of the stub 7, in a coupling region for the coupling partner 29. The housing part 8 has a side 9 which is directed towards the support 3 and has an outer contour that corresponds to a functional surface 10, e.g. a lens, which is to be formed in this region and belongs to the electrooptical module. The housing part 8 is constructed as a predetermined breaking point 8a on its border or edge and has a break-off attachment 11 which projects outward out of the stub 7.

FIGS. 3 and 4 show how the support 3 with the electrooptical transducer 4 can be accommodated in a precisely positioned manner in the module housing 1 in a position which can be seen from FIG. 1.

In the case of the exemplary embodiment according to FIG. 3, a positioning device 12 is provided for the precise positioning of the support 3 with the electrooptical transducer 4 in the module housing 1. The positioning device 12 has positioning extensions 13 and 14 provided on the outside of the module housing 1. Positioning hooks 15 and 16, which are provided on the support 3, interact with the positioning extensions 13 and 14. In order to position the support 3 with the electrooptical transducer 4, the latter is pushed into the module housing 1. The positioning hooks 15 and 16 have wedge-shaped recesses 17 and 18 which are guided against and joined together with correspondingly wedge-shaped ends 19 and 20 of the adjustment extensions 13 and 14 of the module housing 1.

A different positioning device is used in the case of the embodiment according to FIG. 4. This positioning device contains latching recesses 21 and 22 on the inside of the module housing 1. Latch-in noses 23 and 24, which are formed by the support 3, engage in the latching recesses 21 and 22. Stop elements 25 and 26, which are likewise formed on the support 3, ensure that the support 3 is precisely positioned and secured in the module housing 1. The stop elements 25 and 26 are guided against an end surface 27 of the module housing 1, resulting in latching of the support 3 in the module housing 1.

Figure 2:
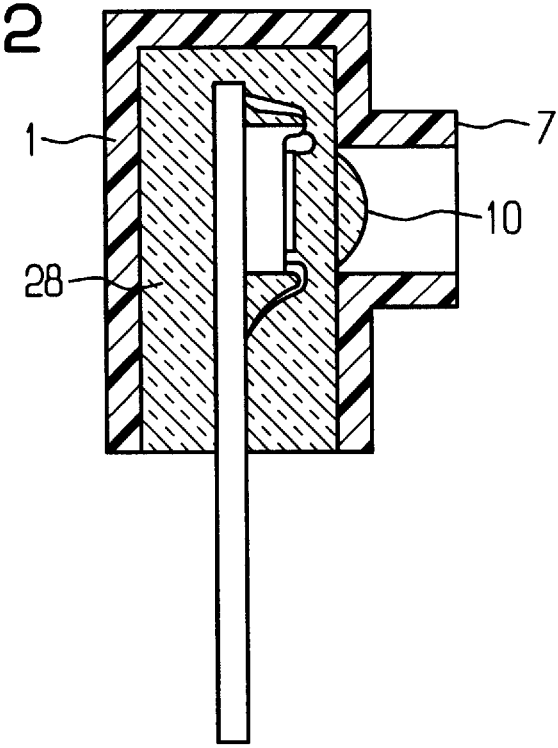
FIG. 2 is a sectional view of a finished electrooptical module which corresponds to FIG. 1.

FIG. 2 shows the finished electrooptical module in the same sectional illustration as in FIG. 1. In this case, the inside of the module housing 1 has been filled with a translucent or transparent, moldable material 28 which, following introduction, is cured to form a molding. This also forms the functional surface 10 in the form of a lens. Once the moldable material has cured, the housing part 8 is removed from the stub 7 by virtue of pressure being applied to the break-off attachment 11, as a result of which the functional surface 10 is exposed.

We claim:

1. A method for producing an electrooptical module, which comprises:

providing a module housing acting as a mold and having an opening and a coupling region for a coupling partner;

aligning and fitting at least one electrooptical transducer on a support having a positioning device;

introducing the support having the at least one electrooptical transducer through the opening;

precisely positioning the support having the at least one electrooptical transducer in the module housing with the positioning device;

providing a housing part having an inner side with a configuration corresponding to an outer contour of a functional surface;

placing the housing part in the coupling region; and introducing a translucent moldable material into the module housing and at least partially encasing the support having the transducer with the moldable material forming a molding having the least one functional surface for coupling to a coupling partner.

2. The method according to claim 1, which comprises providing a predetermined breaking point on an edge of the housing part.

3. The method according to claim 1, which comprises configuring the coupling region of the module housing as a stub forming an insertion socket for receiving the coupling partner.

4. The method according to claim 1, which comprises providing a break-off attachment on an outer side of the housing part, and removing the housing part from the module housing by subjecting the break-off attachment to the action of force once the molding has been formed.

5. The method according to claim 1, which comprises providing extensions on the support as the positioning device, and connecting the extensions to the module housing when the support with the transducer is positioned in the module housing.

6. A mold for producing an optical module, comprising:

a module housing having an opening and a coupling region for a coupling partner;

a support to be introduced through said opening into said module housing, said support having a positioning device for precisely positioning said support in said module housing;

at least one electrooptical transducer fitted and aligned on said support;

a translucent, moldable material at least partially encasing said support with said at least one electrooptical transducer to form a molding having at least one functional surface with an outer contour for coupling to the coupling partner; and a housing part disposed in said coupling region and having an inner side with a configuration corresponding to said outer contour of said functional surface.

7. The mold according to claim 6, wherein said housing part has an edge with a predetermined breaking point.

8. The mold according to claim 6, wherein said coupling region is a stub forming an insertion socket for receiving the coupling partner.

9. The mold according to claim 6, wherein said housing part has an outer side with a break-off attachment.

* * * * *

UNITED STATES PATENT AND TRADEMARK OFFICE
CERTIFICATE OF CORRECTION

PATENT NO. : 6,309,566 B1  
DATED : October 30, 2001  
INVENTOR(S) : Gustav Müller et al.

It is certified that error appears in the above-identified patent and that said Letters Patent is hereby corrected as shown below:

<u>Title page,</u>
Item [22], should read as follows:
-- Filed: Feb. 22, 2000. --

Signed and Sealed this

Twelfth Day of November, 2002

Attest:

Attesting Officer

JAMES E. ROGAN
*Director of the United States Patent and Trademark Office*